(12) United States Patent
Eguchi et al.

(10) Patent No.: US 7,181,722 B2
(45) Date of Patent: Feb. 20, 2007

(54) METHOD OF DIVIDING CIRCUIT PATTERN, METHOD OF MANUFACTURING STENCIL MASK, STENCIL MASK AND METHOD OF EXPOSURE

(75) Inventors: Hideyuki Eguchi, Tokyo (JP); Takashi Yoshii, Tokyo (JP); Hiroshi Sugimura, Tokyo (JP); Akira Tamura, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 230 days.

(21) Appl. No.: 10/948,154

(22) Filed: Sep. 24, 2004

(65) Prior Publication Data

US 2005/0079426 A1 Apr. 14, 2005

Related U.S. Application Data

(63) Continuation of application No. PCT/JP03/03731, filed on Mar. 26, 2003.

(30) Foreign Application Priority Data

Mar. 26, 2002 (JP) ............................. 2002-085748

(51) Int. Cl.
*G06F 17/50* (2006.01)
(52) U.S. Cl. .......................................... 716/21; 716/19
(58) Field of Classification Search .................. 716/19, 716/21
See application file for complete search history.

(56) References Cited

U.S. PATENT DOCUMENTS

| | | | | |
|---|---|---|---|---|
| 5,347,592 A | | 9/1994 | Yasuda et al. ............... 382/144 |
| 5,874,198 A | * | 2/1999 | Okino ......................... 430/296 |
| 6,647,543 B2 | * | 11/2003 | Yamada et al. ................ 716/21 |
| 6,741,733 B1 | * | 5/2004 | Kobinata ..................... 382/149 |
| 6,855,467 B2 | * | 2/2005 | Amemiya ..................... 430/30 |
| 2001/0028984 A1 | | 10/2001 | Yamashita et al. ............. 430/5 |
| 2002/0124235 A1 | * | 9/2002 | Yamashita .................... 716/19 |
| 2003/0017401 A1 | | 1/2003 | Kawata et al. ................. 430/5 |
| 2003/0027058 A1 | * | 2/2003 | Kato ............................. 430/5 |
| 2003/0054580 A1 | * | 3/2003 | Yamamoto et al. ........... 438/22 |
| 2003/0093767 A1 | * | 5/2003 | Murai et al. .................. 716/21 |

FOREIGN PATENT DOCUMENTS

| | | |
|---|---|---|
| JP | 7-29793 | 1/1995 |
| JP | 7-271012 | 10/1995 |
| JP | 2001-244192 | 9/2001 |

* cited by examiner

*Primary Examiner*—Sun James Lin

(57) ABSTRACT

A method of dividing a circuit pattern for creating complementary stencil masks corresponding to complementary patterns, the method comprising a step of dividing a circuit pattern into a plurality of complementary patterns including a first complementary pattern comprising a pattern of a cantilevered beam member having a support portion width $W_1$ and a length $L_1$, and a second complementary pattern comprising a pattern of a both end-supported beam member having a support portion width $W_2$ and a length $L_2$. The dividing of the circuit pattern is performed in a manner that a aspect ratio $A_1$ ($L_1/W_1$) of the pattern of the cantilevered beam member is confined to not more than 100, and that a aspect ratio $A_2$ ($L_2/W_2$) of the pattern of the both end-supported beam member is confined to not more than 150.

14 Claims, 10 Drawing Sheets

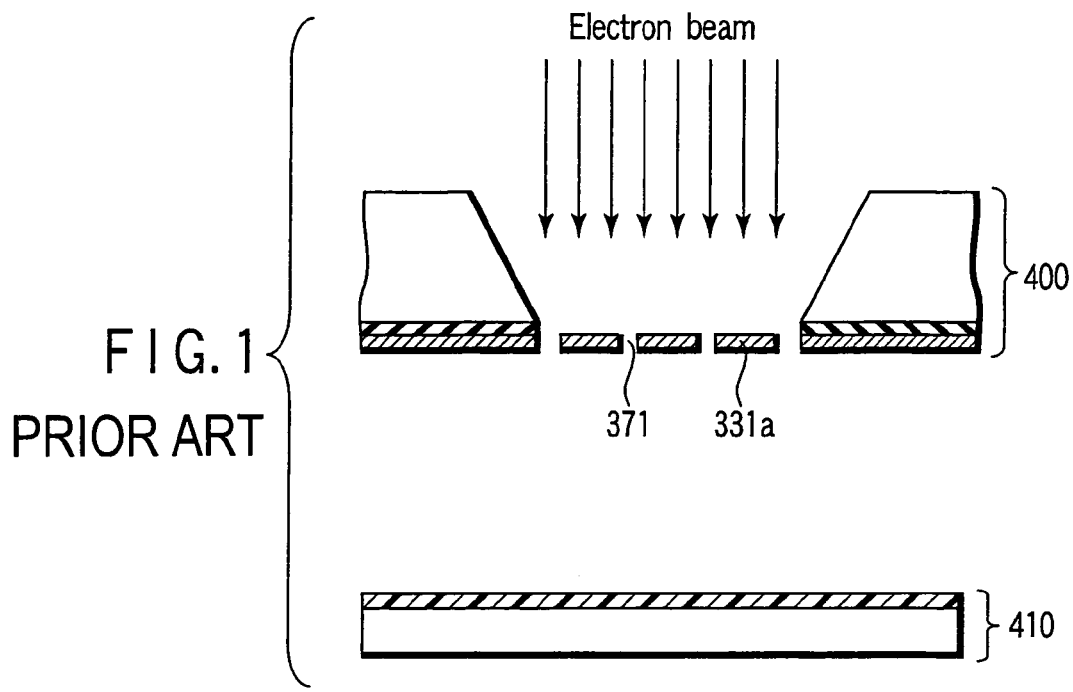
FIG. 1 PRIOR ART
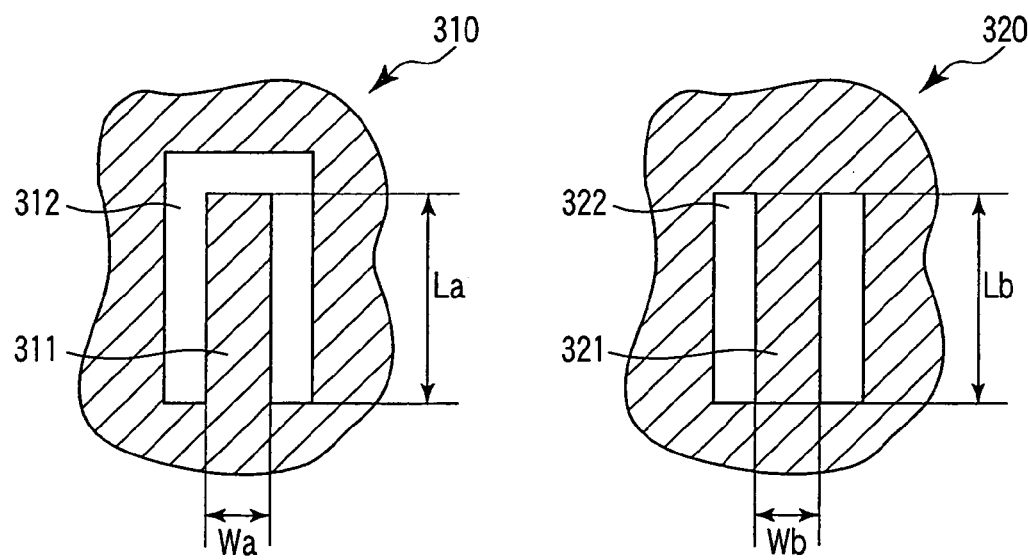
FIG. 2A PRIOR ART
FIG. 2B PRIOR ART

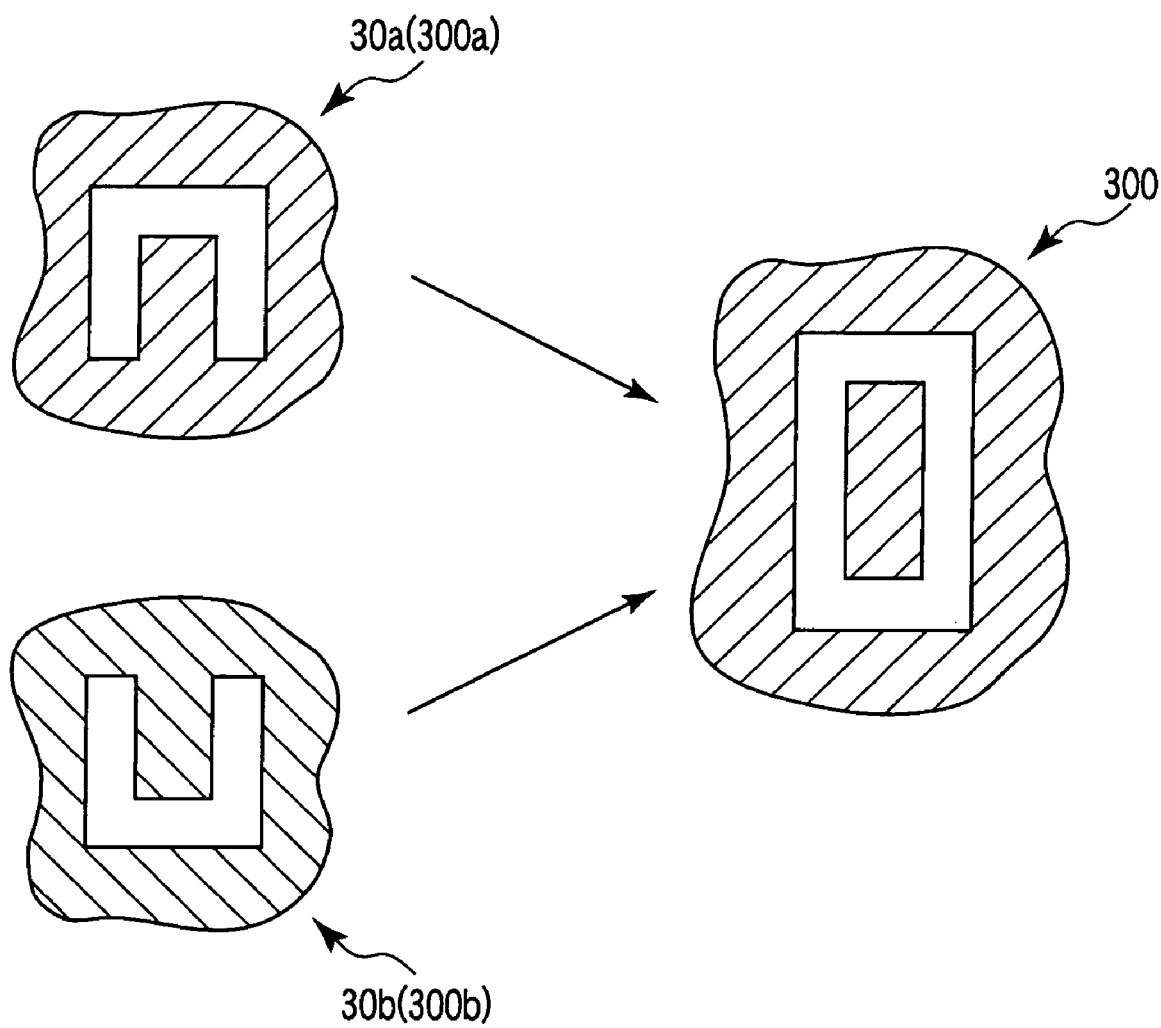
F I G. 12

METHOD OF DIVIDING CIRCUIT PATTERN, METHOD OF MANUFACTURING STENCIL MASK, STENCIL MASK AND METHOD OF EXPOSURE

CROSS-REFERENCE TO RELATED APPLICATIONS

This is a Continuation Application of PCT Application No. PCT/JP03/03731, filed Mar. 26, 2003, which was published under PCT Article 21 (2) in Japanese.

This application is based upon and claims the benefit of priority from prior Japanese Patent Application No. 2002-085748, filed Mar. 26, 2002, the entire contents of which are incorporated herein by reference.

BACKGROUND OF THE INVENTION

1. Field of the Invention

This invention relates to a method of dividing a circuit pattern to form a plurality of complementary patterns, a method of manufacturing a stencil mask composed of a combination of a plurality of complementary stencil masks corresponding to a plurality of partitioned complementary patterns, a stencil mask obtained by such a manufacturing method, and a method of exposure using such a stencil mask.

2. Description of the Related Art

In recent years, concomitant with a trend to further enhance the fineness of a semiconductor integrated circuit, the research and development are now extensively conducted with regard to electron beam lithography, ion beam lithography, etc. as manufacturing techniques of the semiconductor integrated circuit. The stencil mask employed in these lithography techniques is constituted of an Si self-supporting membrane having a thickness of not more than 2 μm and a transfer through-hole pattern formed therein.

Among these lithography techniques, there has been developed, as a method suitable for coping with the miniaturization of semiconductor devices, an electron beam exposure method such as a method called a cell projection exposure method or a block exposure method, where an electron beam is employed, or a method called EPL (Electron Projection Lithography), which is capable of realizing a higher throughput.

In the EPL method, a circuit pattern is transferred onto a photosensitive layer-coated substrate 410 by making use of a stencil mask 400 as shown in FIG. 1. In this stencil mask, a circuit pattern of fine through-holes 371, i.e. a stencil (openings) is formed in a self-supporting membrane 331a of predetermined thickness. An electron beam is passed through the fine through-holes 371, irradiating onto a sensitive substrate 410 in a form of the circuit pattern, thus performing an electron beam projection exposure.

As for the thickness of the self-supporting membrane 331a, it is more preferable that the thickness be as large as possible in order to enable the electron beam to disperse and to enhance the rigidity of the self-supporting membrane. On the other hand, in view of problems such as workability of the transfer through-hole pattern and the gravity deflection of the self-supporting membrane, there are limitations with regard to the thickness of the self-supporting membrane. For example, in the case of a self-supporting material having a modulus of longitudinal elasticity ranging from about 100 to 200 GPa, such as Si, there is known a self-supporting membrane having a thickness of about 0.4 to 3 μm though specific thickness of the self-supporting membrane may vary depending on the magnitude of the acceleration voltage of the electron beam to be irradiated.

However, in the case where a fine through-hole having a width of not more than several micrometers and a length larger than the width is to be formed in such a self-supporting membrane having a thickness of several micrometers as described above, if a beam-like member such as a cantilevered beam member where three sides thereof are surrounded by a fine through-hole or a both end-supported beam member which is located between a pair of fine through-holes, is formed, there will be raised not only the problem of deformation due to the gravity deflection of the beam-like member, but also the problem of generating the phenomenon that, due to the deformation of the beam-like member, the beam-like members are permitted to be in contact with each other or any one of the beam-like members is permitted to be in contact with a neighboring circuit pattern. For the purpose of overcoming these problems, it is conceivable to partition the circuit pattern formed in the mask into a plurality of complementary patterns so as to obtain a complementary stencil mask having a plurality of complementary transfer through-hole patterns corresponding to these complementary patterns.

With respect to the method of dividing a circuit pattern into a plurality of complementary patterns, there is known a method wherein an upper limit of the ratio between the length L and the width W of a beam-like member pattern (L/W), i.e. an upper limit of aspect ratio is set to a predetermined value at first, and then the circuit pattern is partitioned so as to make the aspect ratio lower than the value. Next, a dividing method of the circuit pattern as well as a method of manufacturing a stencil mask composed of a combination of complementary stencil masks each having a complementary transfer through-hole pattern corresponding to each of the complementary patterns partitioned as described above will be explained.

First of all, in a step of designing a mask pattern, a cantilevered beam member pattern 311 where three sides thereof are surrounded by a through-hole pattern 312 in a transfer pattern 310, or a both end-supported beam member pattern 321 which is interposed between fine through-hole patterns 322 in a transfer pattern 320 as shown in FIGS. 2A and 2B is detected. These transfer patterns 310 and 320 are then partitioned so as to enable the aspect ratio (La/Wa) of the cantilevered beam member pattern 311 as well as the aspect ratio (Lb/Wb) of the both end-supported beam member pattern 321 to have predetermined set values.

Namely, as shown in FIG. 3, the transfer pattern 310 is partitioned into a first complementary transfer pattern 310a consisting of a first complementary through-hole pattern 312a and a first complementary beam-like member pattern 311a, and a second complementary transfer pattern 310b consisting of a second complementary through-hole pattern 312b and a second complementary beam-like member pattern 311b. Further, as shown in FIG. 4, the transfer pattern 320 is partitioned into a first complementary transfer pattern 320a consisting of a first complementary through-hole pattern 322a and a first complementary beam-like member pattern 321a, and a second complementary transfer pattern 320b consisting of a second complementary through-hole pattern 322b and a second complementary beam-like member pattern 321b.

A method of manufacturing a complementary stencil mask having patterned configurations corresponding to the partitioned complementary transfer patterns 310a and 310b, respectively, will next be explained with reference to FIGS. 5A to 5F.

First of all, as shown in FIG. 5A, an SOI substrate 330 composed of an Si active layer 331 having a thickness of 2 µm, an intermediate oxide film layer 332 having a thickness of 1 µm, and a Si supporting layer 333 having a thickness of 525 µm is prepared.

Then, a photoresist is coated on the surface of the Si supporting layer 333 to form a photoresist film which is worked by means of photolithography to form a resist pattern 341 as shown in FIG. 5B. Thereafter, as shown in FIG. 5C, by making use of this resist pattern 341 as a mask, the Si supporting layer 333 is etched away by means of a known dry etching method until the intermediate oxide film layer 332 is exposed, thereby forming an opening 351 of the supporting layer.

Thereafter, the resist pattern 341 deposited on the Si supporting layer 333 is removed by means of ashing treatment, etc. and the intermediate oxide film layer 332 exposed through the opening 351 of the supporting layer is removed by making use of a 3 wt % aqueous solution of HF, etc. to thereby form an opening 351 of the supporting layer. Further, the resultant substrate is subjected to a cleaning treatment by way of the conventional RCA cleaning, etc. to thereby obtain a blank 330a for stencil mask (hereinafter referred to as a stencil mask blank 330a) as shown in FIG. 5D.

Subsequently, an electron-beam-sensitive resist is coated on the surface of the Si active layer 331 of the stencil mask blank 330a and the resultant electron-beam-sensitive resist layer is subjected to an electron beam exposure by making use of the pattern data of the aforementioned complementary transfer patterns 310a and 310b. Then, the electron-beam-sensitive resist layer is further subjected to a development treatment to obtain a complementary resist pattern 361 as shown in FIG. 5E.

Thereafter, by making use of the complementary resist pattern 361 as an etching mask, the Si active layer 331 is etched away by means of the conventional plasma etching using an etching gas such as $SF_6$, fluorocarbon, etc. Then, the complementary resist pattern 361 is removed and the resultant substrate is subjected to a cleaning treatment to obtain two complementary stencil masks 400 each having a self-supporting membrane 331a which is constituted of a self-supporting membrane consisting of the Si active layer 331 and having fine through-holes 371 formed therein as shown in FIG. 5F.

Further, by way of the same procedures as described above, another two complementary stencil masks, each having a prescribed pattern, can be obtained in accordance with the aforementioned complementary transfer patterns 320a and 320b.

FIG. 6 shows an example of a transfer pattern which is formed through a combination of complementary stencil masks corresponding with the complementary transfer patterns which are partitioned according to the aforementioned conventional method.

In the case of the conventional complementary stencil mask, since the preset value of the aspect ratio of the partitioned beam-like member patterns 311a and 311b ($L_c/W_c$, $L_d/W_d$) is made constant, the beam-like member patterns 311a and 311b are partitioned according to the predetermined aspect ratio irrespective of the values the widths $W_c$ and $W_d$ of the beam-like member patterns 311a and 311b would take. However, depending on the width of the support portion or on the configuration of the beam-like member, it is possible to form the beam-like member patterns 311a and 311b having a much larger aspect ratio. Namely, depending on the width of the support portion or on the configuration of the beam-like member, the dividing of the beam-like member patterns has been conventionally performed to an unnecessary extent in number of partitions.

The increase in number of partitions would raise not only a problem that it takes much time in dividing a transfer pattern into complementary patterns in the step of designing the mask pattern of a beam-like member, but also a problem that the quantity of data on the complementary patterns is caused to increase, thereby prolonging the time for handling the data.

Additionally, when the number of the fine through-holes having a small opening is increased due to unnecessary dividing, the number of defective mask is caused to increase due to the fact that any foreign matter that may be present in the fine through-hole cannot be removed in the cleaning step of the mask, thereby raising a problem that the yield will be deteriorated in the manufacture of a mask.

Further, since the complementary patterns thus partitioned are designed to be connected with each other so as to obtain a prescribed pattern in the exposure step for transferring the pattern to the photosensitive layer formed on a semiconductor substrate, the superfluous dividing would lead to an increase in number of connected portions, thus raising the problem that the risk of generating defective masks due to defective connection of the complementary patterns would be increased.

Further, as an alternative method, there has been conventionally proposed a method wherein the width as well as the length of the through pattern of circuit pattern are detected at first and then compared, to select the longer width and length and, based on this selection, the transfer pattern is partitioned in a manner such that the selected one is not larger than a preset value.

This conventional method however is accompanied with a problem that since the mechanical strength of the beam-like member of the stencil mask to be created by a transfer pattern is not taken into consideration, where the aspect ratio of the beam-like member and the width of the support portion are selected to satisfy prescribed values, the beam-like members may adhere to each other or any one of the beam-like members may adhere to a neighboring circuit pattern, depending on the manufacturing process of the mask.

Therefore, one of the objects of the present invention is to provide a method of dividing a circuit pattern, which makes it possible, on the occasion of dividing a circuit pattern into complementary patterns to perform an efficient dividing of a circuit pattern in a manner to avoid contact between the beam-like members of high aspect ratio or between any one of these beam-like members and a neighboring circuit pattern in the manufacturing process of a stencil mask, thereby making it possible to manufacture a stencil mask with a high yield.

Another object of the present invention is to provide a method of manufacturing a stencil mask which is constituted of a combination of a plurality of complementary stencil masks corresponding to a plurality of complementary patterns which have been partitioned as described above.

A further object of the present invention is to provide a stencil mask which is manufactured according to the aforementioned method.

Another object of the present invention is to provide a method of exposure using the aforementioned stencil mask.

BRIEF SUMMARY OF THE INVENTION

According to a first aspect of the present invention, there is provided a method of dividing a circuit pattern for creating complementary stencil masks corresponding to complementary patterns, the method comprising a step of dividing a circuit pattern into a plurality of complementary patterns including a first complementary pattern comprising a pattern of a cantilevered beam member having a support portion width $W_1$ and a length $L_1$, and a second complementary pattern comprising a pattern of a both end-supported beam member having a support portion width $W_2$ and a length $L_2$; wherein the dividing of the circuit pattern is performed in a manner that a aspect ratio $A_1$ ($L_1/W_1$) of the pattern of the cantilevered beam member is confined to not more than 100, and that a aspect ratio $A_2$ ($L_2/W_2$) of the pattern of the both end-supported beam member is confined to not more than 150.

According to a second aspect of the present invention, there is provided a method of dividing a circuit pattern for creating complementary stencil masks corresponding to complementary patterns, the method comprising a step of dividing a circuit pattern into a plurality of complementary patterns including a first complementary pattern comprising a pattern of a both end-supported beam member having a support portion width $W_3$ and a length $L_3$, and a second complementary pattern comprising a pattern of a both end-supported beam member having a support portion width $W_4$ and a length $L_4$; wherein the dividing of the circuit pattern is performed in a manner that aspect ratios $A_3$ ($L_3/W_3$) and $A_4$ ($L_4/W_4$) of the patterns of these both end-supported beam members are respectively confined to not more than 150.

According to a third aspect of the present invention, there is provided a method of dividing a circuit pattern for creating complementary stencil masks corresponding to complementary patterns, the method comprising a step of dividing a circuit pattern into a plurality of complementary patterns including a first complementary pattern comprising a pattern of a cantilevered beam member having a support portion width $W_5$ and a length $L_5$, and a second complementary pattern comprising a pattern of a cantilevered beam member having a support portion width $W_6$ and a length $L_6$; wherein the dividing of the circuit pattern is performed in a manner that aspect ratios $A_5$ ($L_5/W_5$) and $A_6$ ($L_6/W_6$) of the patterns of these cantilevered beam members are respectively confined to not more than 100.

According to a fourth aspect of the present invention, there is provided a method of manufacturing a stencil mask composed of a combination of a plurality of complementary stencil masks, the method comprising the steps of: dividing a circuit pattern into a plurality of complementary patterns including a first complementary pattern comprising a pattern of a cantilevered beam member having a support portion width $W_1$ and a length $L_1$, and a second complementary pattern comprising a pattern of a both end-supported beam member having a support portion width $W_2$ and a length $L_2$; and creating a plurality of complementary stencil masks corresponding to the plurality of complementary patterns; wherein the dividing of the circuit pattern is performed in a manner that a aspect ratio $A_1$ ($L_1/W_1$) of the pattern of the cantilevered beam member is confined to not more than 100, and that a aspect ratio $A_2$ ($L_2/W_2$) of the pattern of the both end-supported beam member is confined to not more than 150.

According to a fifth aspect of the present invention, there is provided a method of manufacturing a stencil mask composed of a combination of a plurality of complementary stencil masks, the method comprising the steps of: dividing a circuit pattern into a plurality of complementary patterns including a first complementary pattern comprising a pattern of a both end-supported beam member having a support portion width $W_3$ and a length $L_3$, and a second complementary pattern comprising a pattern of a both end-supported beam member having a support portion width $W_4$ and a length $L_4$; and creating a plurality of complementary stencil masks corresponding to the plurality of complementary patterns; wherein the dividing of the circuit pattern is performed in a manner that aspect ratios $A_3$ ($L_3/W_3$) and $A_4$ ($L_4/W_4$) of the patterns of these both end-supported beam members are respectively confined to not more than 150.

According to a sixth aspect of the present invention, there is provided a method of manufacturing a stencil mask composed of a combination of a plurality of complementary stencil masks, the method comprising the steps of: dividing a circuit pattern into a plurality of complementary patterns including a first complementary pattern comprising a pattern of a cantilevered beam member having a support portion width $W_5$ and a length $L_5$, and a second complementary pattern comprising a pattern of a cantilevered beam member having a support portion width $W_6$ and a length $L_6$; and creating a plurality of complementary stencil masks corresponding to the plurality of complementary patterns; wherein the dividing of the circuit pattern is performed in a manner that aspect ratios $A_5$ ($L_5/W_5$) and $A_6$ ($L_6/W_6$) of the patterns of these cantilevered beam members are respectively confined to not more than 100.

According to a seventh aspect of the present invention, there is provided a stencil mask which is manufactured by any of the aforementioned manufacturing methods of stencil masks.

According to an eighth aspect of the present invention, there is provided a method of exposure of charged corpuscular beam, the method comprising a step of irradiating -charged corpuscular beam onto a surface of substrate successively through a plurality of the complementary stencil masks which are created by the aforementioned method of manufacturing the stencil masks to thereby shape the charged corpuscular beam into a combined configuration of transferring patterns on the surface of substrate.

BRIEF DESCRIPTION OF THE SEVERAL VIEWS OF THE DRAWING

FIG. 1 is a diagram illustrating an example of the method of exposure of projected electron beam;

FIGS. 2A and 2B are diagrams illustrating an example of the conventional transfer pattern comprising a cantilevered beam member and a both end-supported beam member;

FIG. 12 is a diagram illustrating an example of a synthesized circuit pattern comprising a combination of complementary patterns that have been partitioned according to a third aspect of the present invention;

DETAILED DESCRIPTION OF THE INVENTION

Next, various embodiments of the present invention will be explained in detail with reference to drawings.

The present inventors have conducted extensive research on the effective dividing of a circuit pattern, which makes it possible to avoid contact between the beam-like members or between any one of these beam-like members and a neighboring circuit pattern in the manufacturing process of a stencil mask. As a result, it has been found that when the dividing of the circuit pattern is performed in a manner that a aspect ratio (L/W) of the beam-like member is confined to not more than 100 in the case of the cantilevered beam member, and to not more than 150 in the case of the both end-supported beam member, it is possible to avoid contact between the beam-like members or between any one of these beam-like members and a neighboring circuit pattern in the manufacturing process of a stencil mask.

Figure 10:
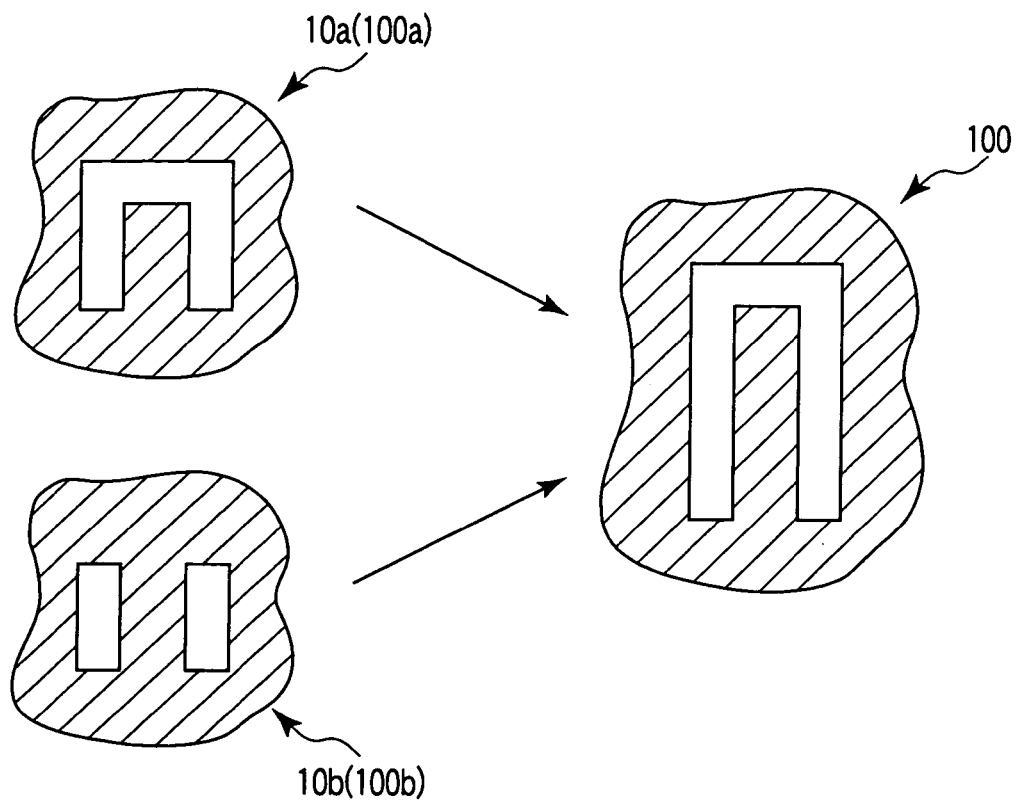
FIG. 10 is a diagram illustrating an example of a synthesized circuit pattern comprising a combination of complementary patterns that have been partitioned according to a first aspect of the present invention.
Figure 11:
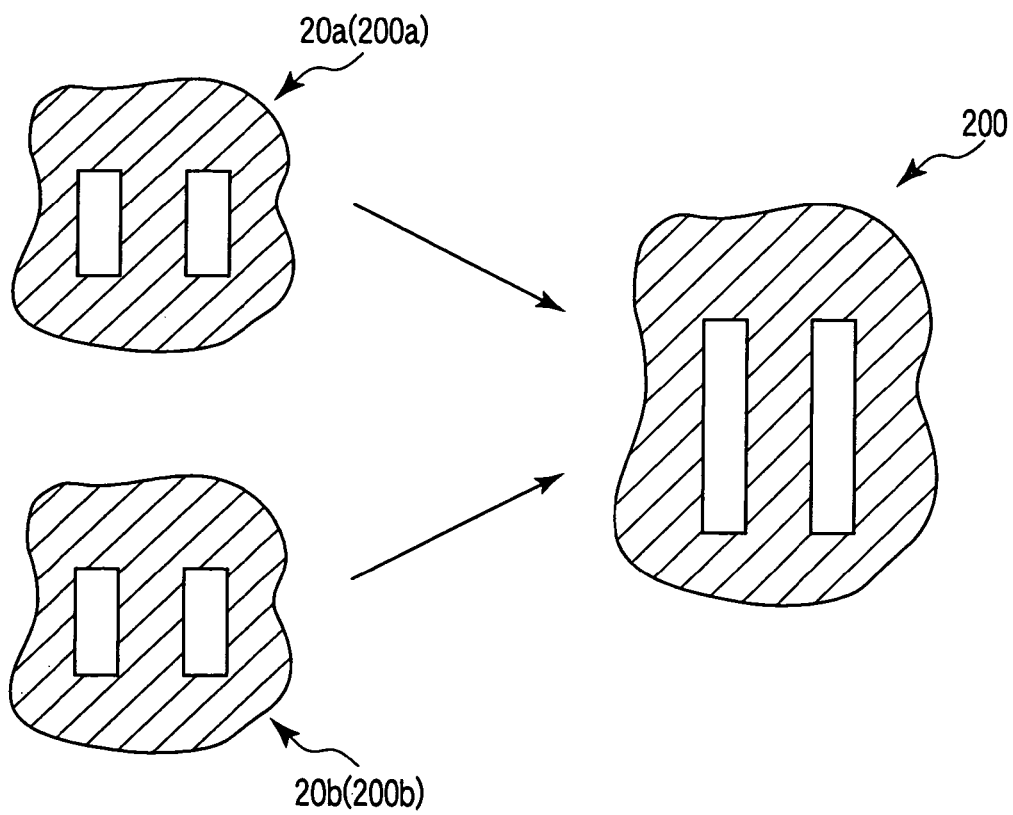
FIG. 11 is a diagram illustrating an example of a synthesized circuit pattern comprising a combination of complementary patterns that have been partitioned according to a second aspect of the present invention.

Namely, the present inventors have manufactured various kinds of stencil masks comprising a cantilevered beam member as shown in FIG. 10 and a both end-supported beam member as shown in FIG. 11, and then determined the relationship between the width W of support portion and the aspect ratio (L/W) which makes it possible to generate the phenomenon of contact between the beam-like members or between the beam-like member and a neighboring pattern. The results found by the present inventors are shown below. Incidentally, the thickness of the self-supporting membrane constituting the stencil mask was set to 2 μm.

In the case of the cantilevered beam member:

| Width of support portion (μm) | Aspect ratio |
|---|---|
| 2.2 | 318 |
| 2 | 300 |
| 1.5 | 266 |
| 0.8 | 250 |
| 0.6 | 166 |
| 0.5 | 140 |

In the case of the opposite ends-supported member:

| Width of support portion (μm) | Aspect ratio |
|---|---|
| 2.2 | 350 |
| 2 | 333 |
| 1.2 | 375 |
| 0.8 | 333 |
| 0.6 | 250 |
| 0.4 | 200 |
| 0.35 | 200 |

Figure 13:
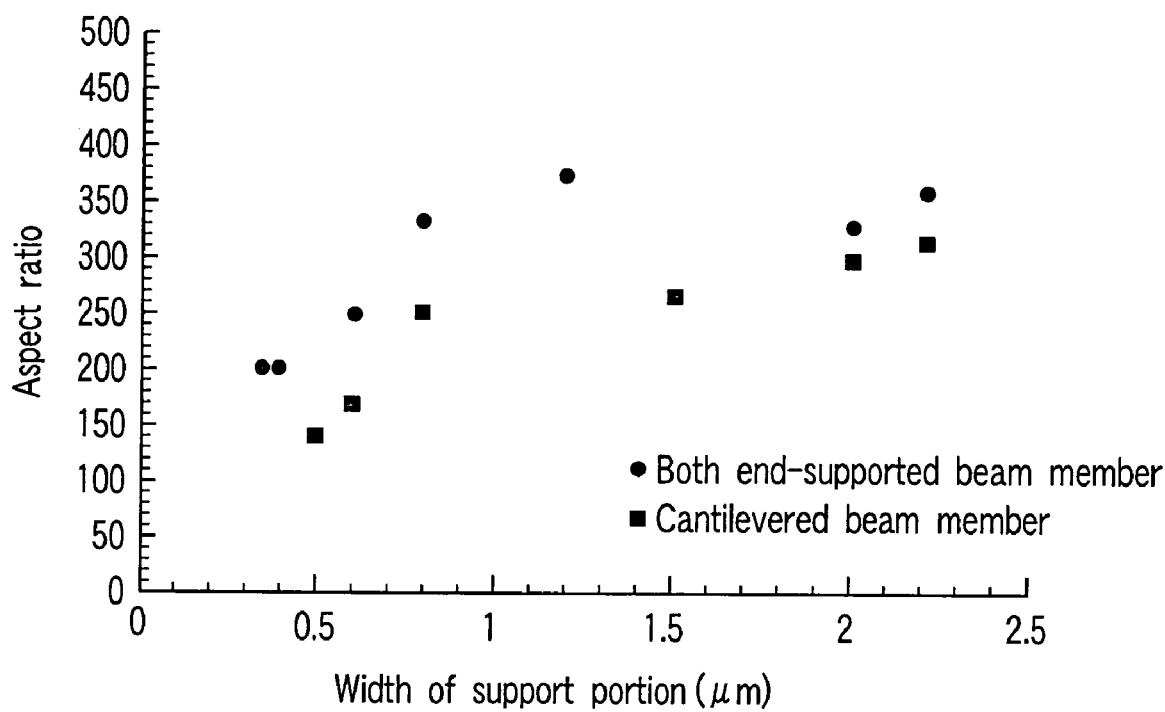
FIG. 13 is a graph plotting the width W of support portion and the aspect ratio (L/W) which makes it possible to generate the phenomenon of contact between the beam-like members or between the beam-like member and a neighboring pattern in the manufacture of various kinds of stencil masks comprising the beam-like member are plotted.

These results are plotted in FIG. 13. As shown in FIG. 13, it will be understood that as the width W of the support portion of the beam-like member is decreased to 1 μm or less, the aspect ratio (L/W) which makes it possible to generate the phenomenon of contact between the beam-like members or between the beam-like member and a neighboring pattern decreases sharply.

Figure 14:
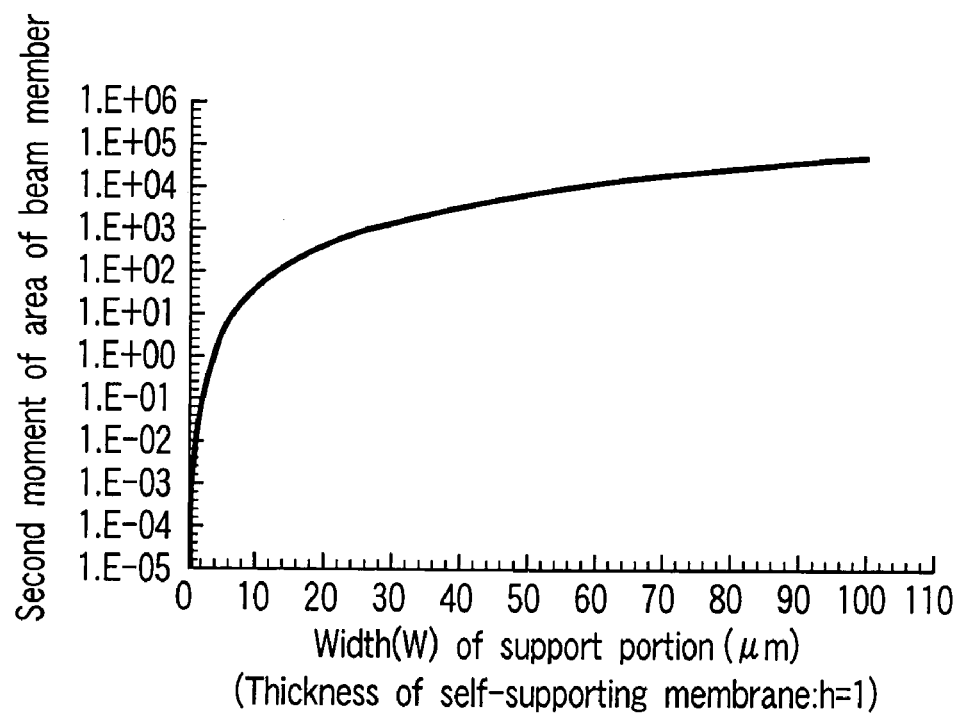
FIG. 14 is a graph showing a second moment of area of the beam-like member relative to the width W of support portion under the condition where the thickness h of self-supporting membrane is set to 1.

The reason for this can be explained as follows. Namely, when the Young's modulus of the beam-like member is represented by E, and a second moment of area of the beam-like member is represented by I, it will be clear from a known formula on material dynamics that the magnitude of displacement (magnitude of deflection) of the beam-like member is inversely proportional to the flexural rigidity EI of the beam-like member, i.e., the flexural rigidity decreases as the width W of the support portion decreases. More specifically, when the thickness h of the self-supporting membrane of stencil mask is assumed as one unit length, i.e. 1 and the width of the support portion is represented by W, the second moment of area I of the beam-like member which corresponds to the displacement in horizontal direction in the top plane of the self-supporting membrane of the beam-like member can be given by: $I=(1 \cdot W^3)/12$. In this case however, if a region where W is smaller than 10 is present, since the value of I decreases sharply as shown in FIG. 14, the beam-like member may be rendered more deformable, thereby permitting defects to be easily generated in the mask on account of the phenomenon of contact between the beam-like members or between the beam-like member and a neighboring pattern.

It will be seen from FIG. 13 that when a circuit pattern is partitioned in a manner that a aspect ratio (L/W) of the beam-like member is confined to not more than 100 in the case of the cantilevered beam member, and to not more than 150 in the case of the both end-supported beam member, it is possible to avoid contact between the beam-like members or between any one of these beam-like members and a neighboring circuit pattern in the manufacturing process of a stencil mask.

Incidentally, to partition the circuit pattern in a manner to make the aspect ratio (L/W) of the beam-like member become less than 1 may be impractical. Further, it may be especially preferable to partition the circuit pattern in a manner that the aspect ratio (L/W) may be confined to not more than 50 in the case of the cantilevered beam member, and to not more than 75 in the case of the both end-supported beam member. These preferable ranges are selected in consideration of variations in degree of the connection between the beam-like members, depending on the subsequent steps, such as cleaning that may be executed after the formation of the supplementary patterns. Namely, these preferable ranges are obtained by multiplying the aspect ratio defined above according to the present invention by a value of 0.5 as a safety factor.

Incidentally, irrespective of the kinds of beam-like members, i.e. either the cantilevered beam member or the both end-supported beam member, the width of the support portion of the beam-like member should be confined to 10 h or less relative to the thickness h of the membrane, under which conditions, the effects of the supplementary dividing according to the present invention become more conspicuous.

Figure 3:
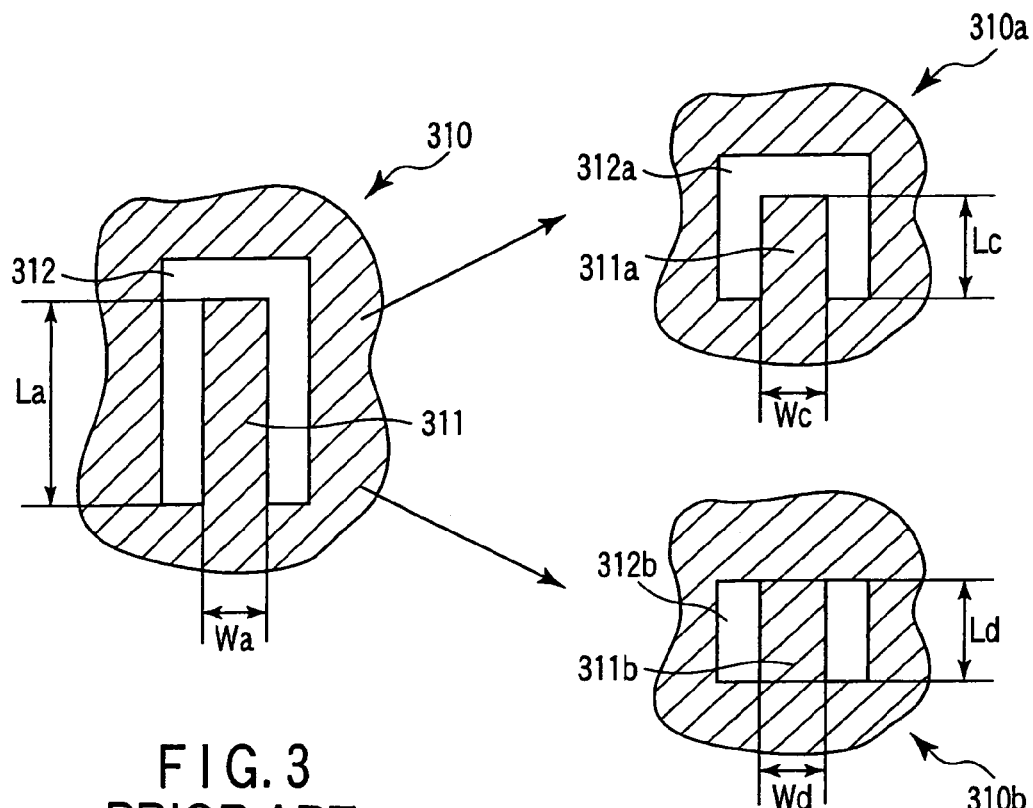
FIG. 3 is a diagram illustrating an example of the conventional method for dividing a transfer pattern.
Figure 4:
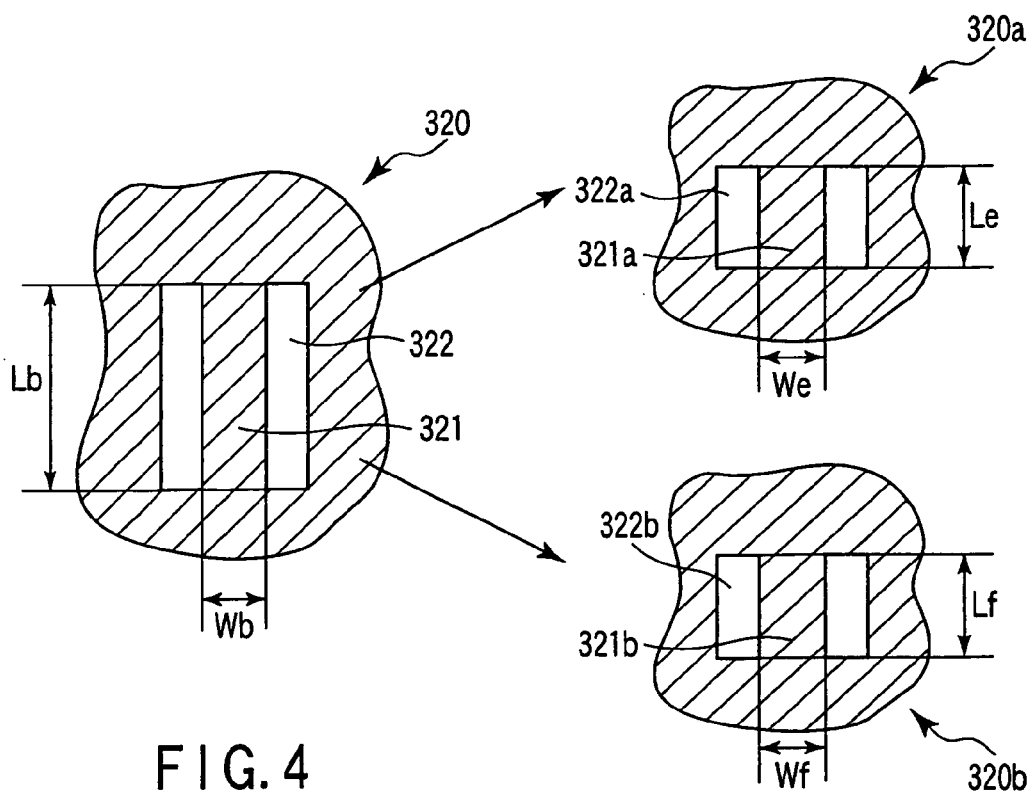
FIG. 4 is a diagram illustrating another example of the conventional method for dividing a transfer pattern.
Figure 5A:
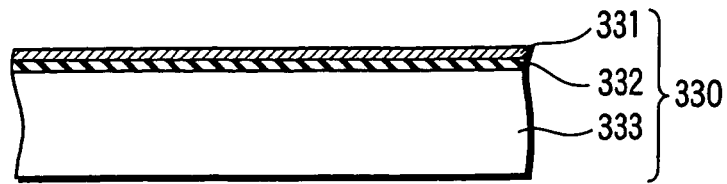
FIGS. 5A to 5F show respectively a cross-sectional view illustrating the step of manufacturing complementary stencil masks according to the prior art.
Figure 5B:
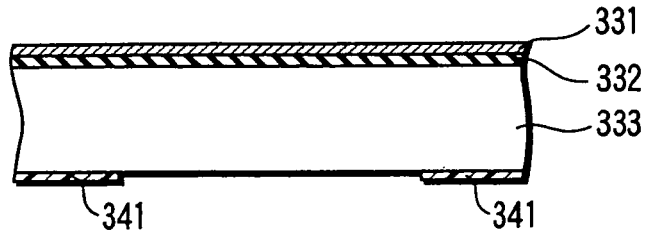
Figure 5C:
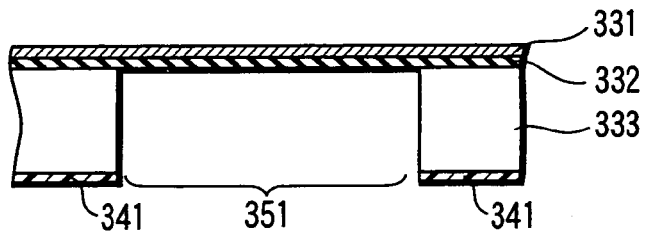
Figure 5D:
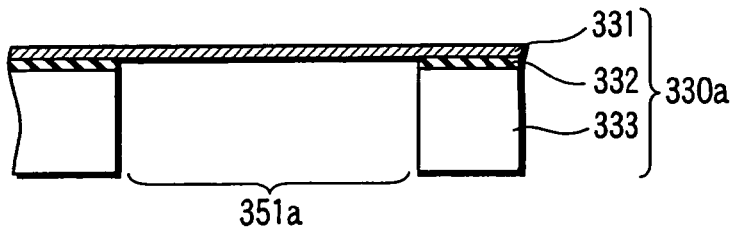
Figure 5E:
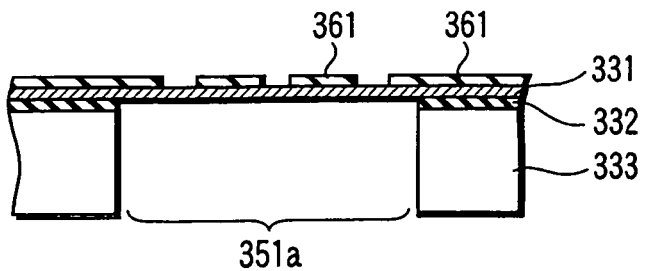
Figure 5F:
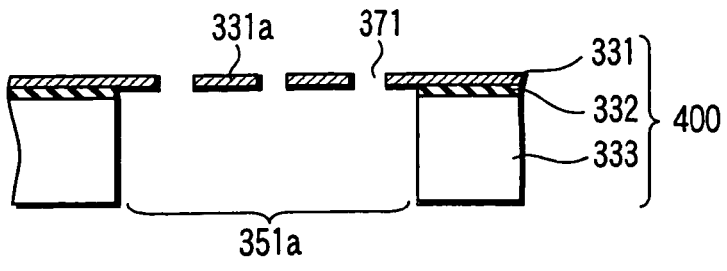
Figure 6:
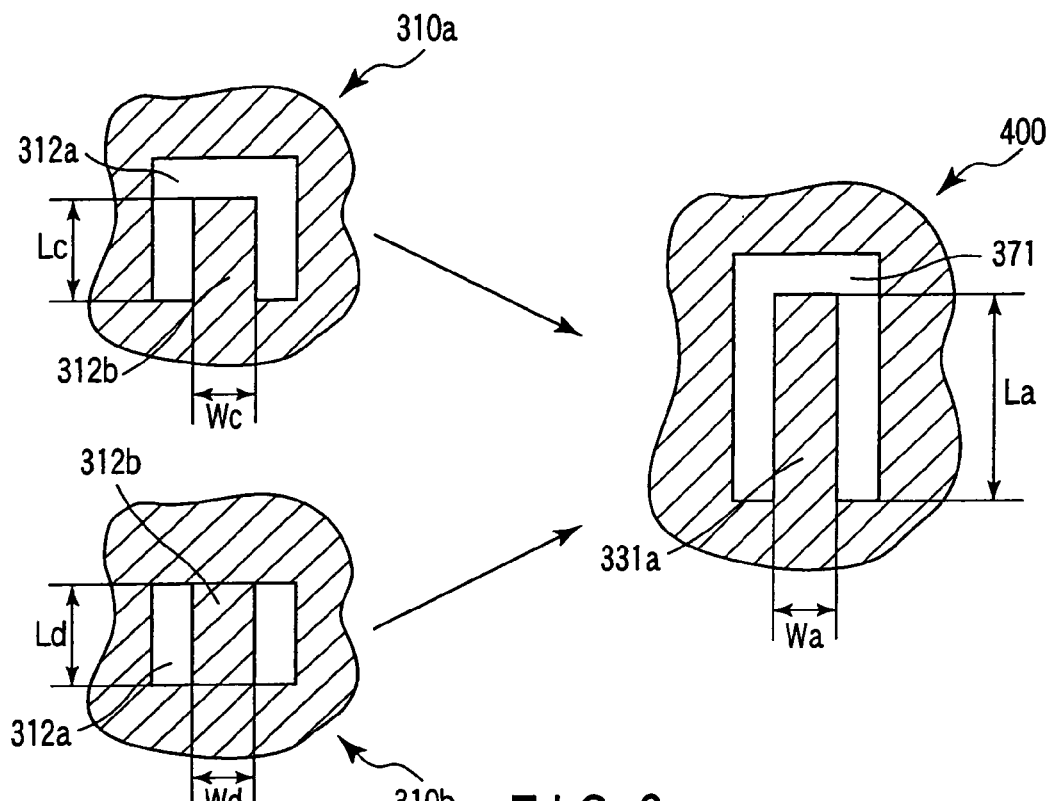
FIG. 6 is a diagram illustrating an example of a synthesized circuit pattern comprising a combination of complementary patterns that have been partitioned according to the conventional method.
Figure 7:
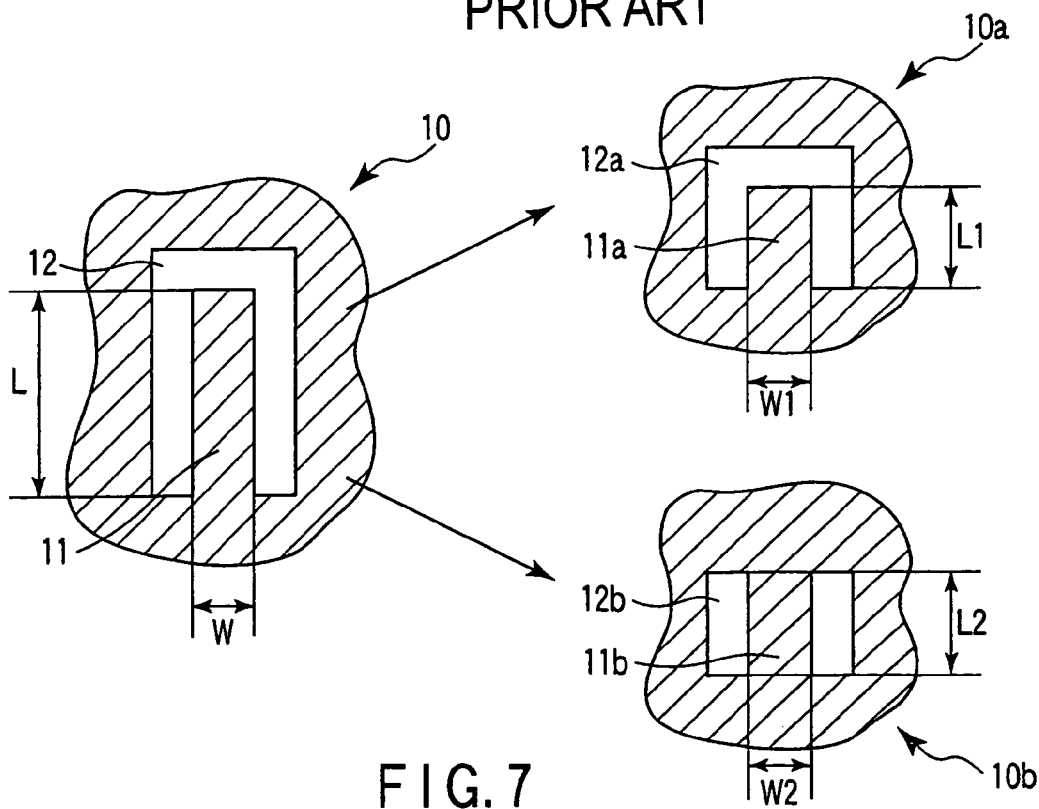
FIG. 7 is a diagram illustrating an example of the method of dividing a circuit pattern according to a first aspect of the present invention.

The aforementioned first aspect of the present invention illustrates a case where the present invention is applied to a transfer pattern comprising a pattern corresponding to a cantilevered beam member. As shown in FIG. 7, a transfer pattern 10 comprising a cantilevered beam member pattern 11 having a width W at the support portion thereof and a length L, where three sides thereof are surrounded by a through-hole pattern 12, is partitioned into a first complementary transfer pattern 10a comprising a cantilevered beam member pattern 11a having a width $W_1$ at the support portion thereof and a length $L_1$, where three sides thereof are surrounded by a through-hole pattern 12a, and a second complementary transfer pattern 10b comprising a both end-supported beam member pattern 11b having a width $W_2$ at the support portion thereof and a length $L_2$, which is interposed between a pair of through-hole patterns 12b. This dividing is performed in such a manner that the widths of $W_1$ and $W_2$ of the support portions are both 10 h or less relative to the thickness h of the self-supporting membrane of the stencil mask, a aspect ratio $A_1$ ($L_1/W_1$) of the cantilevered beam member pattern 11a is confined to not more than 100, and a aspect ratio $A_2$ ($L_2/W_2$) of the both end-supported beam member pattern 11b is confined to not more than 150.

Incidentally, the values of $L_1$ and $L_2$ may be the same or different from each other as long as these values are confined within the aforementioned range. The widths of $W_1$ and $W_2$ are the same as each other.

Figure 8:
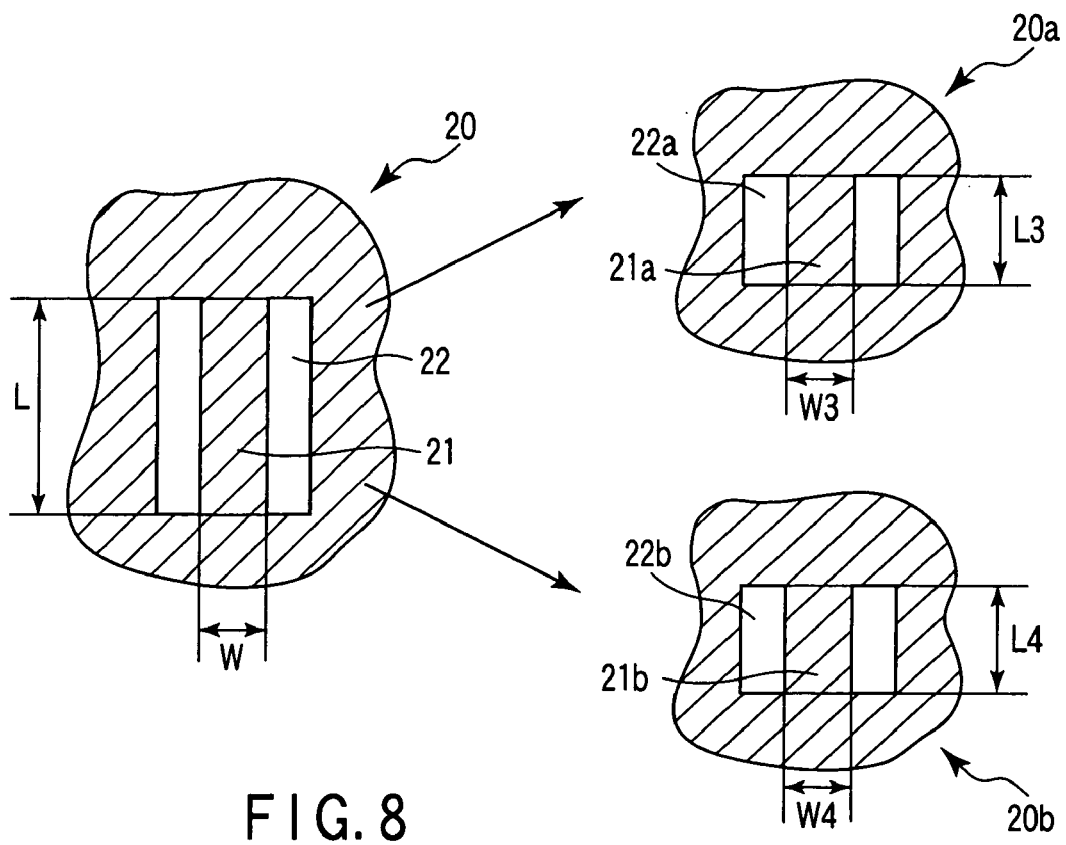
FIG. 8 is a diagram illustrating an example of the method of dividing a circuit pattern according to a second aspect of the present invention.

The aforementioned second aspect of the present invention illustrates a case where the present invention is applied to a transfer pattern comprising a pattern corresponding to a both end-supported beam member. As shown in FIG. 8, a transfer pattern 20 comprising a both end-supported beam member 21 having a width W at the support portion thereof and a length L, which is interposed between a pair of through-hole patterns 22, is partitioned into a first complementary transfer pattern 20a comprising a both end-supported beam member 21a having a width $W_3$ at the support portion thereof and a length $L_3$, which is interposed between a pair of through-hole patterns 22a, and a second complementary transfer pattern 20b comprising a both end-supported beam member pattern 21b having a width $W_4$ at the support portion thereof and a length $L_4$, which is interposed between a pair of through-hole patterns 22b. This dividing is performed in such a manner that the widths of $W_3$ and $W_4$ of the support portions are both 10 h or less relative to the thickness h of the self-supporting membrane of stencil mask, and aspect ratios $A_3$ ($L_3/W_3$) and $A_4$ ($L_4/W_4$) of the both end-supported beam member patterns 21a and 21b are respectively confined to not more than 150.

Incidentally, the values of $L_3$ and $L_4$ may be the same or different from each other. The widths of $W_3$ and $W_4$ are the same with each other.

Figure 9:
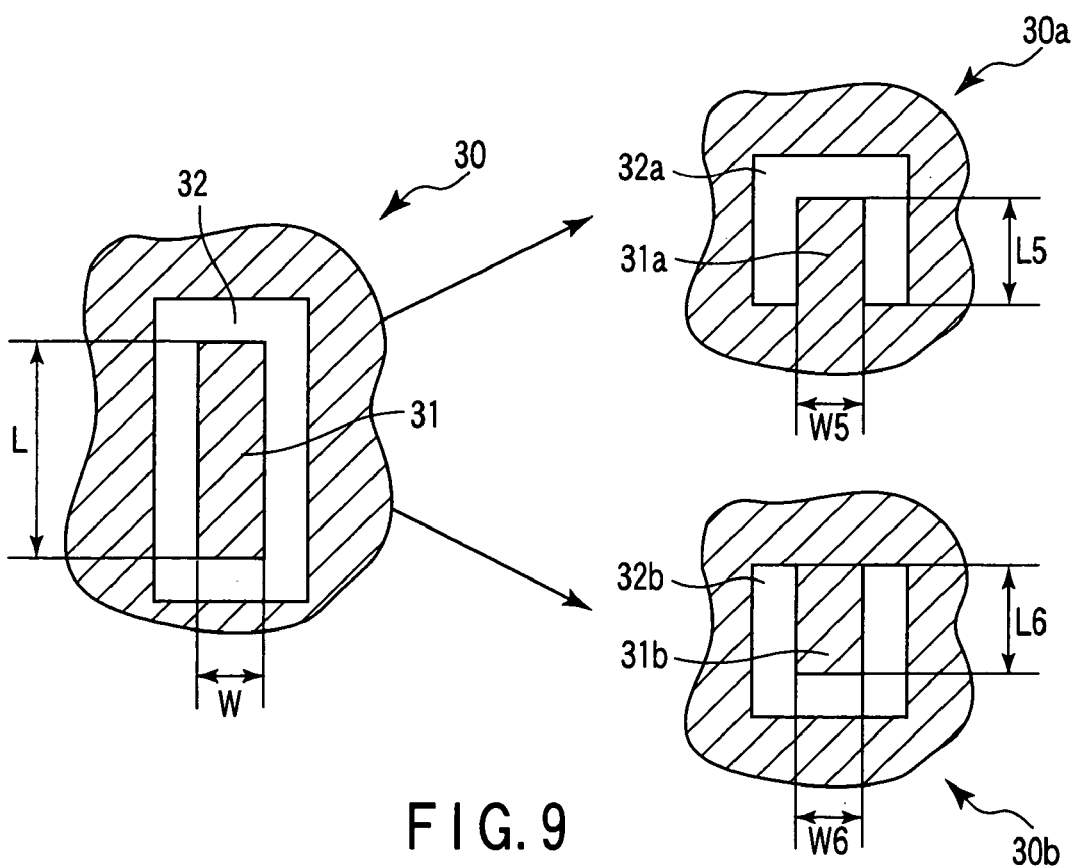
FIG. 9 is a diagram illustrating an example of the method of dividing a circuit pattern according to a third aspect of the present invention.

The aforementioned third aspect of the present invention illustrates a case where the present invention is applied to a transfer pattern comprising a pattern corresponding to a both end-supported beam member. As shown in FIG. 9, a transfer pattern 30 comprising a cantilevered beam member pattern 31 having a width W at the support portion thereof and a length L, where three sides thereof are surrounded by a through-hole pattern 32, is partitioned into a first complementary transfer pattern 30a comprising a cantilevered beam member pattern 31a having a width $W_5$ at the support portion thereof and a length $L_5$, where three sides thereof are surrounded by a through-hole pattern 32a, and a second complementary transfer pattern 30b comprising a cantilevered beam member pattern 31a having a width $W_6$ at the support portion thereof and a length $L_6$, where three sides thereof are surrounded by a through-hole pattern 32b. This dividing is performed in such a manner that the widths of $W_5$ and $W_6$ of the support portions are both 10 h or less relative to the thickness h of the self-supporting membrane of stencil mask, that aspect ratios $A_5$ ($L_5/W_5$) and $A_6$ ($L_6/W_6$) of the cantilevered beam member patterns 31a and 31b are respectively confined to not more than 100.

Incidentally, the values of $L_5$ and $L_6$ may be the same or different from each other. The widths of $W_5$ and $W_6$ are the same with each other.

In the foregoing descriptions, the present invention has been explained with reference to three kinds of embodiments. However, the gist of the present invention resides in a manner of regulating the aspect ratio of complementary pattern that has been created on a mask through the dividing of a circuit pattern. Namely, the regulation of the aspect ratio is performed in conformity with specific configuration of the beam-like member. Therefore, there is no limitation with regard to the configuration of circuit pattern.

Figure 16:
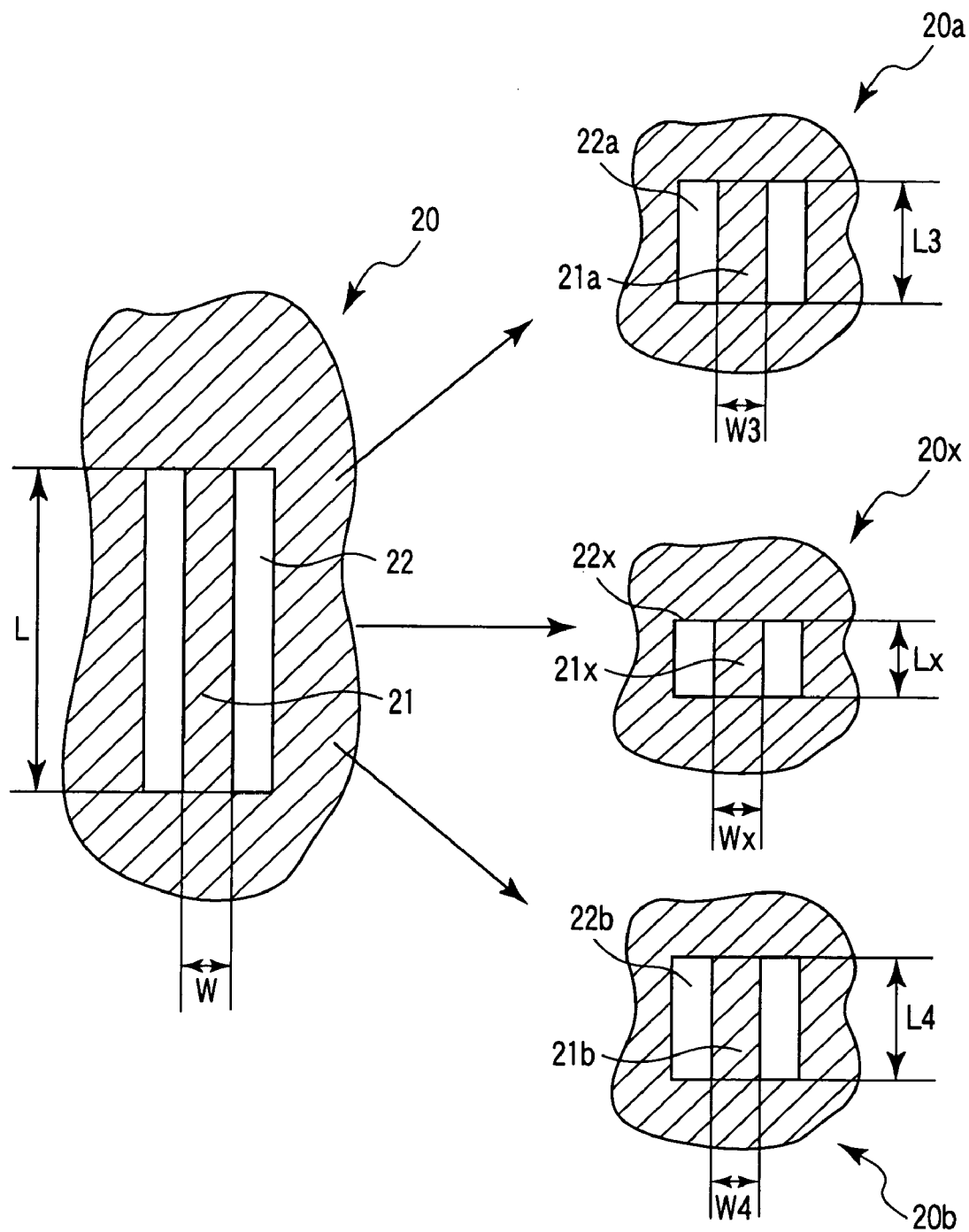
FIG. 16 is a diagram illustrating an example wherein a circuit pattern in partitioned into three sections according to another aspect of the present invention.

Each of the complementary patterns in these embodiments is explained with reference to a two-part dividing as shown in the drawings. However, according to the present invention, the number of complementary patterns of the both end-supported beam member may be increased so as to include a three-part dividing as shown in FIG. 16.

Next, a method of manufacturing a stencil mask by making use of the complementary through-hole patterns 10a and 10b that have been partitioned as described above will be explained with reference to FIGS. 15A to 15F.

Figure 15A:
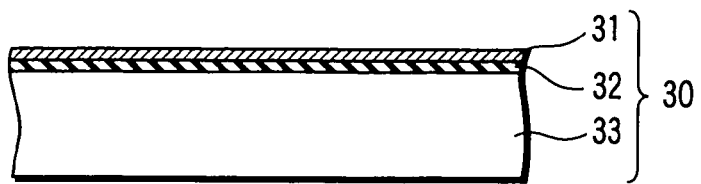
FIGS. 15A to 15F show respectively a cross-sectional view illustrating the step of manufacturing complementary stencil masks according to the present invention.

First of all, as shown in FIG. 15A, an SOI substrate 30 comprising, for example, an Si active layer 31 having a thickness of 2 μm, an intermediate oxide film layer 32 having a thickness of 1 μm, and an Si support layer 33 having a thickness of 525 μm is prepared.

Figure 15B:
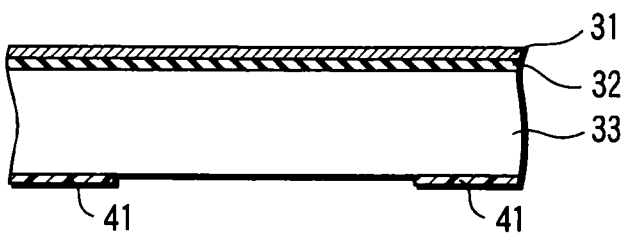
Figure 15C:
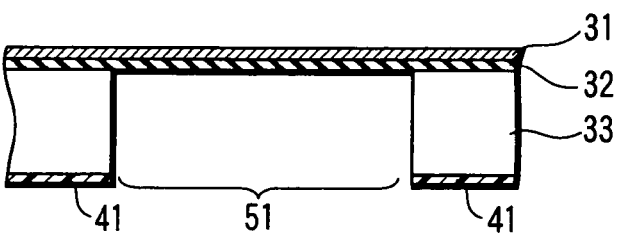
Figure 15D:
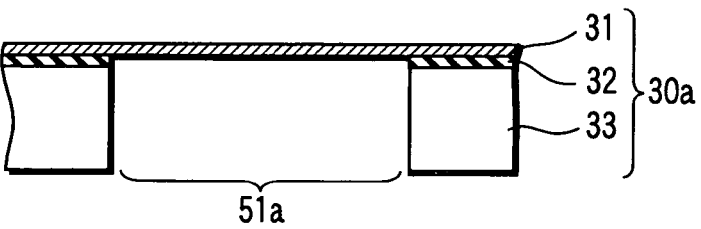

Then, a photoresist is coated on the surface of the Si support layer 33 to form a photoresist film, which is then worked by means of photolithography to form a resist pattern 41 as shown in FIG. 15B. Then, as shown in FIG. 15C, by making use of this resist pattern 41 as a mask, the Si support layer 33 is etched by means of the conventional dry etching method until the intermediate oxide film layer 32 is permitted to expose to thereby form a through-support layer opening 51.

Subsequently, the resist pattern 41 formed on the Si support layer 33 is removed by means of ashing treatment, etc. Then, by making use of a 3 wt % aqueous solution of HF, etc., the intermediate oxide film layer 32 existing inside the through-support layer opening 51 is removed to form a through-support layer opening 51a. Further, the substrate is subjected to cleaning treatment such as known RCA cleaning, etc. to obtain a blank 30a for the stencil mask.

Figure 15E:
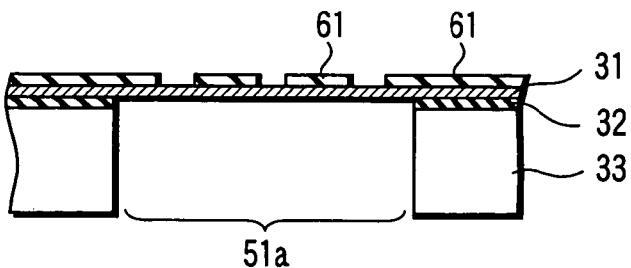

Thereafter, an electron beam sensitive resist is coated on the surface of Si active layer 31 of the blank 30a for the stencil mask. Then, by making use of the pattern data of the complementary transfer patterns 10a and 10b, the electron beam sensitive resist is subjected to electron beam exposure and then further subjected to development treatment by making use of a prescribed developing solution to form a complementary resist pattern 61 as shown in FIG. 15E.

In this embodiment, there is explained a case wherein the complementary resist patterns are formed by means of electron beam exposure based on the pattern data of the complementary transfer patterns 10a and 10b. However, the complementary resist patterns may be formed by making use of an exposure mask which can be manufactured through the employment of the complementary transfer patterns 10a and 10b.

Figure 15F:
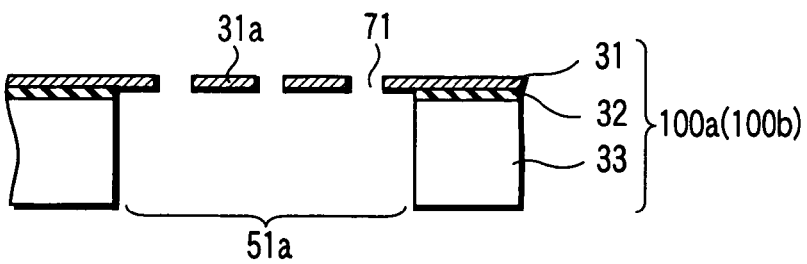

Then, by making use of the complementary resist pattern 61 as an etching mask, the Si active layer is subjected to etching treatment by means of known plasma etching using a gas such as $SF_6$, fluorocarbon, etc. to form fine through-holes 71. Thereafter, the complementary resist pattern 61 is removed and the resultant substrate is subjected to cleaning treatment to obtain a complementary stencil mask 100a comprising a cantilever-like beam member wherein the fine through-holes 71 are formed in a self-supporting membrane constituted of the Si active layer 31a as shown in FIG. 15F. The other complementary stencil mask 100b comprising a both end-supported beam member can be obtained also in the same manner as described above.

With respect to the manufacture of the complementary stencil mask by making use of the complementary transfer patterns 20a and 20b, since it can be manufactured by following the same steps as described above, the details thereof are omitted herein.

Incidentally, in order to prevent the phenomenon of contact between the beam-like members or between the beam-like member and a neighboring pattern due to surface tension, the drying step on the occasion of cleaning should preferably be performed by making use of isopropyl alcohol (IPA) which is lower in surface tension than pure water or by making use of a drying method such as supercritical drying.

Incidentally, the aspect ratio may be selected not only for the purpose of preventing the phenomenon of contact between the beam-like members in the cleaning step thereof, but also for the purpose of minimizing, as much as possible, the displacement of the fine through-hole that may be generated on the occasion of attaching a mask to a securing ring, etc., the displacement of the fine through-hole due to a membrane stress that may be generated on occasion of forming a conductive film on the surface of a stencil mask, and the displacement of the fine through-hole due to thermal expansion at the time of electron beam exposure.

Further, in the case of the cantilevered beam member, when the aspect ratio is increased, the deformation of the cantilevered beam member toward the outside of the plane of the self-supporting membrane is more likely to be generated, and hence it is necessary to take into consideration the deformation of the cantilevered beam member toward the outside of the plane of the self-supporting membrane. In this case, there is a possibility of generating not only the phenomenon of contact between the cantilevered beam members of the self-supporting membrane, but also the phenomenon that a distal end portion of the self-supporting membrane is permitted to run away from the self-supporting membrane and adhere onto the plane of the self-supporting membrane. However, according to the method of the present invention to partition a transfer pattern, it is made possible to prevent the generation of this phenomenon of contact by limiting the aspect ratio of the beam-like member to not more than a prescribed value.

According to the present invention, there is also provided a method of irradiating charged corpuscular beam onto a surface of electron beam sensitive layer which is deposited on the surface of semiconductor silicon substrate, etc. by making use of complementary stencil masks which are created as described above.

Namely, by making use of not only a complementary stencil mask 100a comprising a first complementary pattern 10a but also a complementary stencil mask 100b comprising a second complementary pattern 10b, both created as described above, the complementary patterns 10a and 10b are successively transferred through exposure to the surface of a photosensitive layer-coated substrate (not shown) and combined with each other, thereby making it possible to transfer a circuit pattern 100 comprising a pattern of cantilevered beam members onto the photosensitive layer-coated substrate, as shown in FIG. 10.

Furthermore, by making use of not only a complementary stencil mask 200a comprising a first complementary pattern 20a but also a complementary stencil mask 200b comprising a second complementary pattern 20b, the complementary patterns 20a and 20b are successively transferred through exposure to the surface of a photosensitive layer-coated substrate (not shown) and combined with each other, thereby making it possible to transfer a circuit pattern 200 comprising a pattern of both end-supported beam member onto the photosensitive layer-coated substrate as shown in FIG. 11.

Furthermore, by making use of not only a complementary stencil mask 300a comprising a first complementary pattern 30a but also a complementary stencil mask 300b comprising a second complementary pattern 30b, the complementary patterns 30a and 30b are successively transferred through exposure to the surface of a photosensitive layer-coated substrate (not shown) and combined with each other, thereby making it possible to transfer a circuit pattern 300 comprising a pattern of opposite ends-nonsupported beam-like member onto the photosensitive layer-coated substrate as shown in FIG. 12.

Two complementary patterns are combined with each other as described above and then the electron beam sensitive layer is exposed to electron beam irradiation in a form of a circuit pattern, after which the electron beam sensitive layer is subjected to a developing treatment, thereby making it possible to form a resist pattern.

According to the exposure method as described above, it is now possible to realize a transfer of pattern with high precision to the electron beam sensitive layer which has been formed on the substrate of semiconductor silicon substrate, etc., thus making it possible to create a pattern of semiconductor device with high yield.

Next, the present invention will be explained in detail with reference to examples.

EXAMPLE 1

First of all, in a step of designing a mask pattern, a transfer pattern 10 comprising a through-hole pattern 12, and a cantilevered beam member pattern 11 having a width W of 2 μm at the support portion thereof and a length L of 400 μm was detected. Then, as shown in FIG. 7, this transfer pattern 10 was partitioned into two parts, i.e. a complementary pattern 10a comprising a cantilevered beam member pattern 11a having a length $L_1$ of 180 µm and a width $W_1$ of 2 µm at the support portion thereof, and a complementary pattern 10b comprising a both end-supported beam member pattern 11b having a length $L_2$ of 220 µm and a width $W_2$ of 2 µm at the support portion thereof.

In this case, the aspect ratio $A_1$ ($L_1/W_1$) of the cantilevered beam member pattern 11a of the complementary pattern 10a was 90, and the aspect ratio $A_2$ ($L_2/W_2$) of the both end-supported beam member pattern 11b of the complementary pattern 10b was 110.

By making use of these complementary patterns 10a and 10b, complementary stencil masks 100a and 100b were manufactured by following the steps illustrated in FIGS. 15A to 15F.

Namely, an electron-beam-sensitive layer deposited on the surface of an Si active layer 31 having a thickness of 2 µm and formed on a blank 30a for stencil mask was subjected to an electron beam exposure. Then, the electron-beam-sensitive resist layer was subjected to a development treatment to form a complementary resist pattern 61. Thereafter, by making use of the complementary resist pattern 61 as an etching mask, the Si active layer 31 was etched away by means of the conventional plasma etching using $SF_6$ gas to form fine through-holes 71. Then, the complementary resist pattern 61 was removed and the resultant substrate was subjected to a cleaning treatment to obtain a couple of complementary stencil masks 100a and 100b each constituted of a self-supporting membrane consisting of the Si active layer 31 and having fine through-holes 71 formed therein.

In these complementary stencil masks 100a and 100b obtained in this manner, the phenomenon of contact between the beam-like members or between the beam-like member and a neighboring patter was not recognized.

EXAMPLE 2

First of all, in a step of designing a mask pattern, a transfer pattern 20 comprising a through-hole pattern 22, and a both end-supported beam member pattern 21 having a width W of 1.5 µm at the support portion thereof and a length L of 400 µm was detected. Then, as shown in FIG. 8, this transfer pattern 20 was partitioned into two parts, i.e. a complementary pattern 20a comprising a both end-supported beam member pattern 21a having a length $L_3$ of 200 µm and a width $W_3$ of 2 µm at the support portion thereof, and a complementary pattern 20b comprising a both end-supported beam member pattern 21b having a length $L_4$ of 200 µm and a width $W_4$ of 2 µm at the support portion thereof.

In this case, the aspect ratios $A_3$ ($L_3/W_3$) and $A_4$ ($L_4/W_4$) of the both end-supported beam member patterns 21a and 21b of the complementary patterns 20a and 20b were both 100.

By making use of these complementary patterns 20a and 20b, complementary stencil masks 200a and 200b were manufactured by following the steps illustrated in FIGS. 15A to 15F.

Namely, an electron-beam-sensitive layer deposited on the surface of an Si active layer 31 having a thickness of 2 µm and formed on a blank 30a for stencil mask was subjected to an electron beam exposure. Then, the electron-beam-sensitive resist layer was subjected to a development treatment to form a complementary resist pattern 61. Thereafter, by making use of the complementary resist pattern 61 as an etching mask, the Si active layer 31 was etched away by means of the conventional plasma etching using $SF_6$ gas to form fine through-holes 71. Then, the complementary resist pattern 61 was removed and the resultant substrate was subjected to a cleaning treatment to obtain a couple of complementary stencil masks 200a and 200b each constituted of a self-supporting membrane consisting of the Si active layer 31 and having fine through-holes 71 formed therein.

In these complementary stencil masks 200a and 200b obtained in this manner, the phenomenon of contact between the beam-like members or between the beam-like member and a neighboring patter was not recognized.

EXAMPLE 3

First of all, in a step of designing a mask pattern, a frame-like through-hole pattern 32, and an opposite ends-nonsupported beam-like member pattern 31 having a width W of 0.5 µm at the support portion thereof and a length L of 70 µm were detected. Then, as shown in FIG. 9, these patterns were partitioned into two parts, i.e. a complementary pattern 30a comprising a cantilevered beam member pattern 31a having a length $L_5$ of 30 µm and a width $W_5$ of 0.5 µm at the support portion thereof, and a complementary pattern 30b comprising a cantilevered beam member pattern 31b having a length $L_6$ of 200 µm and a width $W_6$ of 0.5 µm at the support portion thereof.

In this case, the aspect ratio $A_5$ ($L_5/W_5$) of the cantilevered beam member pattern 31a of the complementary pattern 30a was 60, and the aspect ratio $A_6$ ($L_6/W_6$) of the cantilevered beam member pattern 31b of the complementary pattern 30b was 80.

By making use of these complementary patterns 30a and 30b, complementary stencil masks 300a and 300b were manufactured by following the steps illustrated in FIGS. 15A to 15F.

Namely, an electron-beam-sensitive layer deposited on the surface of an Si active layer 31 having a thickness of 2 µm and formed on a blank 30a for stencil mask was subjected to an electron beam exposure. Then, the electron-beam-sensitive resist layer was subjected to a development treatment to form a complementary resist pattern 61. Thereafter, by making use of the complementary resist pattern 61 as an etching mask, the Si active layer 31 was etched away by means of plasma etching using $SF_6$ gas to form fine through-holes 71. Then, the complementary resist pattern 61 was removed and the resultant substrate was subjected to a cleaning treatment to obtain a couple of complementary stencil masks 300a and 300b each constituted of a self-supporting membrane consisting of the Si active layer 31 and having fine through-holes 71 formed therein.

In these complementary stencil masks 300a and 300b obtained in this manner, the phenomenon of contact between the beam-like members or between the beam-like member and a neighboring patter was not recognized.

According to the method of dividing a circuit pattern in each of the aforementioned examples, it was possible to obtain a complementary stencil mask which is free from defects such as adhesion of foreign matters or connection of patterns without necessitating unreasonable increase in number of complementary stencil masks. Further, by setting the number of partitions in a circuit pattern, i.e. the number of complementary patterns, to an appropriate value, it is possible to minimize the failure of combination of patterns on the occasion of electron beam projecting exposure, thus making it possible to form a synthesized circuit pattern with a high yield.

As explained above in detail, it is possible, through the employment of a stencil mask obtained by making use of the dividing method of circuit pattern according to the present invention, to prevent the phenomenon of contact between the beam-like members or between the beam-like member and a neighboring pattern that may be generated in the cleaning process, etc.

Further, since it is also possible to prevent superfluous dividing of a circuit pattern, thus making it possible to set the number of dividing to an appropriate value, it is now possible to minimize the failure of combination of patterns on the occasion of electron beam-projecting exposure, thus making it possible to manufacture a stencil mask at high yield.

What is claimed is:

1. A method of dividing a circuit pattern for creating complementary stencil masks corresponding to complementary patterns, the method comprising:
dividing the circuit pattern into a plurality of complementary patterns including a first complementary pattern comprising a pattern of a cantilevered beam member having a support portion width $W_1$ and a length $L_1$, and a second complementary pattern comprising a pattern of a both end-supported beam member having a support portion width $W_2$ and a length $L_2$;
wherein the dividing of the circuit pattern is performed in a manner that an aspect ratio $A_1$ ($L_1/W_1$) of the pattern of the cantilevered beam member is confined to not more than 100, and that an aspect ratio $A_2$ ($L_2/W_2$) of the pattern of the both end-supported beam member is confined to not more than 150.

2. The method of dividing a circuit pattern according to claim 1, wherein the aspect ratio $A_1$ ($L_1/W_1$) of the pattern of the cantilevered beam member is confined within the range of 1 to 50, and the aspect ratio $A_2$ ($L_2/W_2$) of the pattern of the both end-supported beam member is confined within the range of 1 to 75.

3. The method of dividing a circuit pattern according to claim 1, wherein the complementary stencil mask is provided with a self-supporting membrane which is worked into a configuration of the complementary pattern, and the widths of $W_1$ and $W_2$ of the support portions are both 10 times or less relative to the thickness of the self-supporting membrane.

4. A method of dividing a circuit pattern for creating complementary stencil masks corresponding to complementary patterns, the method comprising:
dividing the circuit pattern into a plurality of complementary patterns including a first complementary pattern comprising a pattern of a both end-supported beam member having a support portion width $W_3$ and a length $L_3$, and a second complementary pattern comprising a pattern of a both end-supported beam member having a support portion width $W_4$ and a length $L_4$;
wherein the dividing of the circuit pattern is performed in a manner that aspect ratios $A_3$ ($L_3/W_3$) and $A_4$ ($L_4/W_4$) of the patterns of the both end-supported beam members are respectively confined to not more than 150.

5. The method of dividing a circuit pattern according to claim 4, wherein the aspect ratios $A_3$ ($L_3/W_3$) and $A_4$ ($L_4/W_4$) of the pattern of the both end-supported beam members are respectively confined within the range of 1 to 75.

6. The method of dividing a circuit pattern according to claim 4, wherein the complementary stencil mask is provided with a self-supporting membrane which is worked into a configuration of the complementary pattern, and the widths of $W_3$ and $W_4$ of the support portions are both 10 times or less relative to the thickness of the self-supporting membrane.

7. A method of dividing a circuit pattern for creating complementary stencil masks corresponding to complementary patterns, the method comprising dividing the circuit pattern into a plurality of complementary patterns including a first complementary pattern comprising a pattern of a cantilevered beam member having a support portion width $W_5$ and a length $L_5$, and a second complementary pattern comprising a pattern of a cantilevered beam member having a support portion width $W_6$ and a length $L_6$;
wherein the dividing of the circuit pattern is performed in a manner that aspect ratios $A_5$ ($L_5/W_5$) and $A_6$ ($L_6/W_6$) of the patterns of these cantilevered beam members are respectively confined to not more than 100.

8. The method of dividing a circuit pattern according to claim 7, wherein the aspect ratios $A_5$ ($L_5/W_5$) and $A_6$ ($L_6/W_6$) of the pattern of the cantilevered beam members are respectively confined within the range of 1 to 50.

9. The method of dividing a circuit pattern according to claim 7, wherein the complementary stencil mask is provided with a self-supporting membrane which is worked into a configuration of the complementary pattern, and the widths of $W_5$ and $W_6$ of the support portions are both 10 times or less relative to the thickness of the self-supporting membrane.

10. A method of manufacturing a stencil mask composed of a combination of a plurality of complementary stencil masks, the method comprising:
dividing a circuit pattern into a plurality of complementary patterns including a first complementary pattern comprising a pattern of a cantilevered beam member having a support portion width $W_1$ and a length $L_1$, and a second complementary pattern comprising a pattern of a both end-supported beam member having a support portion width $W_2$ and a length $L_2$; and
creating a plurality of complementary stencil masks corresponding to the plurality of complementary patterns;
wherein the dividing of the circuit pattern is performed in a manner that an aspect ratio $A_1$ ($L_1/W_1$) of the pattern of the cantilevered beam member is confined to not more than 100, and that an aspect ratio $A_2$ ($L_2/W_2$) of the pattern of the both end-supported beam member is confined to not more than 150.

11. A method of manufacturing a stencil mask composed of a combination of a plurality of complementary stencil masks, the method comprising:
dividing a circuit pattern into a plurality of complementary patterns including a first complementary pattern comprising a pattern of a both end-supported beam member having a support portion width $W_3$ and a length $L_3$, and a second complementary pattern comprising a pattern of a both end-supported beam member having a support portion width $W_4$ and a length $L_4$; and
creating a plurality of complementary stencil masks corresponding to the plurality of complementary patterns;
wherein the dividing of the circuit pattern is performed in a manner that aspect ratios $A_3$ ($L_3/W_3$) and $A_4$ ($L_4/W_4$) of the patterns of the both end-supported beam members are respectively confined to not more than 150.

12. A method of manufacturing a stencil mask composed of a combination of a plurality of complementary stencil masks, the method comprising:

dividing a circuit pattern into a plurality of complementary patterns including a first complementary pattern comprising a pattern of a cantilevered beam member having a support portion width $W_5$ and a length $L_5$, and a second complementary pattern comprising a pattern of a cantilevered beam member having a support portion width $W_6$ and a length $L_6$; and creating a plurality of complementary stencil masks corresponding to the plurality of complementary patterns; wherein the dividing of the circuit pattern is performed in a manner that aspect ratios $A_5$ ($L_5/W_5$) and $A_6$ ($L_6/W_6$) of the patterns of these cantilevered beam members are respectively confined to not more than 100.

13. A stencil mask which is manufactured by any one of the methods as claimed in claims 10 to 12.

14. A method of exposure of charged corpuscular beam, the method comprising irradiating charged corpuscular beam onto a surface of a substrate successively through a plurality of the complementary stencil masks which are created by any one of the methods as claimed in claims 10 to 12, thereby shaping the charged corpuscular beam into a combined configuration of transferring patterns on the surface of the substrate.

* * * * *